United States Patent
Disney

(10) Patent No.: US 8,742,490 B2
(45) Date of Patent: Jun. 3, 2014

(54) VERTICAL POWER TRANSISTOR DIE PACKAGES AND ASSOCIATED METHODS OF MANUFACTURING

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/099,252

(22) Filed: May 2, 2011

(65) Prior Publication Data

US 2012/0280308 A1    Nov. 8, 2012

(51) Int. Cl.
*H01L 29/772* (2006.01)
*H01L 21/60* (2006.01)

(52) U.S. Cl.
USPC ........... 257/329; 257/341; 257/723; 257/724; 257/773; 257/328; 438/107; 438/123; 438/268; 438/270; 438/272

(58) Field of Classification Search
USPC ................. 257/341, 723, 724, 773, 328, 329; 438/270, 268, 272, 156
See application file for complete search history.

(56) References Cited

U.S. PATENT DOCUMENTS

| | | | | |
|---|---|---|---|---|
| 4,547,791 A | * | 10/1985 | Roger et al. | 257/370 |
| 4,698,654 A | * | 10/1987 | Kohn | 257/260 |
| 5,296,403 A | * | 3/1994 | Nishizawa et al. | 438/198 |
| 5,308,782 A | * | 5/1994 | Mazure et al. | 438/154 |
| 5,780,327 A | * | 7/1998 | Chu et al. | 438/156 |
| 5,929,481 A | * | 7/1999 | Hshieh et al. | 257/328 |
| 6,440,800 B1 | * | 8/2002 | Lee et al. | 438/270 |
| 6,593,622 B2 | * | 7/2003 | Kinzer et al. | 257/341 |
| 6,774,466 B1 | * | 8/2004 | Kajiwara et al. | 257/673 |
| 6,787,847 B2 | * | 9/2004 | Disney | 257/328 |
| 7,408,251 B2 | * | 8/2008 | Hata et al. | 257/678 |
| 7,432,599 B2 | * | 10/2008 | Verma et al. | 257/777 |
| 7,514,780 B2 | * | 4/2009 | Sakamoto et al. | 257/700 |
| 7,569,920 B2 | * | 8/2009 | Otremba et al. | 257/686 |
| 7,618,896 B2 | * | 11/2009 | Joshi et al. | 438/728 |
| 7,663,212 B2 | * | 2/2010 | Otremba | 257/678 |
| 7,851,856 B2 | * | 12/2010 | Hebert | 257/337 |
| 8,124,453 B2 | * | 2/2012 | Sun et al. | 438/109 |
| 8,138,046 B2 | * | 3/2012 | Pribat et al. | 438/268 |
| 2007/0085187 A1 | * | 4/2007 | Sun et al. | 257/686 |
| 2007/0132079 A1 | * | 6/2007 | Otremba et al. | 257/685 |
| 2008/0067584 A1 | * | 3/2008 | Lui et al. | 257/330 |
| 2009/0224313 A1 | * | 9/2009 | Burke | 257/330 |

* cited by examiner

*Primary Examiner* — Lex Malsawma
*Assistant Examiner* — Sheng Zhu
(74) *Attorney, Agent, or Firm* — Perkins Coie LLP

(57) ABSTRACT

The present technology is directed generally to a semiconductor device. In one embodiment, the semiconductor device includes a first vertical transistor and a second vertical transistor, and the first vertical transistor is stacked on top of the second vertical transistor. The first vertical transistor is mounted on a lead frame with the source electrode of the first vertical transistor coupled to the lead frame. The second vertical transistor is stacked on the first vertical transistor with the source electrode of the second vertical transistor coupled to the drain electrode of the first vertical transistor.

10 Claims, 7 Drawing Sheets

VERTICAL POWER TRANSISTOR DIE PACKAGES AND ASSOCIATED METHODS OF MANUFACTURING

TECHNICAL FIELD

This disclosure relates generally to semiconductor devices, and particularly relates to semiconductor devices with vertical power semiconductor transistors.

BACKGROUND

Vertical power transistors such as vertical metal oxide semiconductor field effect transistor ("MOSFET"), vertical junction field effect transistor ("JFET") or field effect transistor ("FET") with integrated Schottky diode are widely used in power management applications. Some power management applications, for example, half-bridge drivers, synchronous buck converters, and synchronous boost converters, include vertical power transistors that are connected in series.

FIG. 1 illustrates a conventional switching power converter 100 comprising a low side power transistor 101, a high side power transistor 102 and a controller 103. The drain electrode 102D of the high side power transistor 102 is coupled to an input port to receive a power supply VIN. The gate electrode 102G of the high side power transistor 102 and the gate electrode 101G of the low side power transistor 101 are configured to receive gate control signals from the controller 103. The source electrode 102S of the high side power transistor 102 and the drain electrode 101D of the low side power transistor 101 are connected together to form a switching node SW which outputs switching signals. The source electrode 101S of the low side power transistor 101 is connected to ground GND.

In certain high power applications, the high side power transistor 102 and the low side power transistor 101 are implemented as vertical power transistors such as vertical MOSFETs. Vertical power transistors typically comprise a drain electrode on a back surface of the power transistor die, and source and gate electrodes on a top surface of the power transistor die. The high side power transistor 102, the low side power transistor 101 and the controller 103 are typically fabricated on separate semiconductor dies, which are laid out in a lead frame structure 104 in the same plane. The drain electrode 102D of the high side power transistor 102 and the drain electrode 101D of the low side power transistor 101 are mounted to separate, isolated pieces of the lead frame structure 104, as illustrated in FIG. 2.

For high-power devices, the lead frame can be used as a heat sink. For ease of integration onto a printed circuit board ("PCB"), the heat sink is usually at ground potential. In the switching power converter 100 shown in FIG. 1 with the conventional packaging strategy shown in FIG. 2, the drain electrode 102D of the high side power transistor 102 and the drain electrode 101D of the low side power transistor 101, which are attached to the lead frame structure 104, are respectively coupled to a constant high voltage and a switching node which switches between high and low voltages. An exposed lead frame at a constant high voltage is less desirable because it adds a high-voltage heat sink area on the PCB. It is even more undesirable for the exposed lead frame to switch between high and low voltages, as the switching transients may cause electro magnetic interference ("EMI"). Also, the conventional packaging strategy as shown in FIG. 2 can result in a large package size because the dies are arranged side-by-side. Also, different semiconductor dies are interconnected by wirebonding, and thus may introduce parasitic resistance and inductance. Furthermore, the presence of multiple exposed lead frame pieces in close proximity to one another complicates the attachment of the co-packaged product to a PCB.

DETAILED DESCRIPTION

Figure 1:
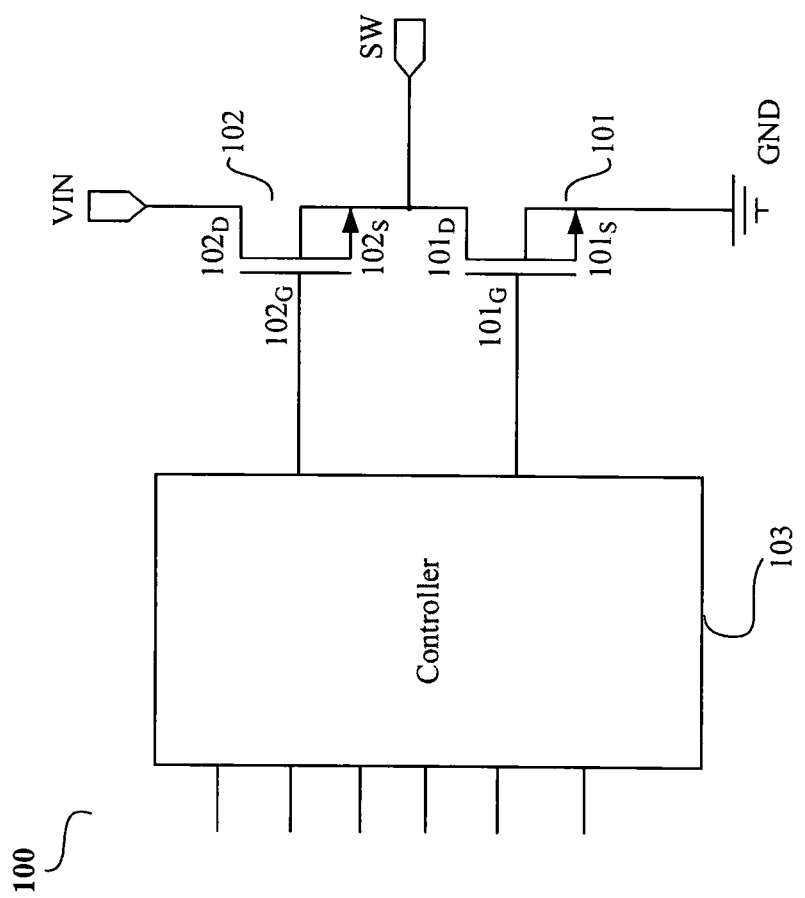
FIG. 1 shows a schematic diagram of a switching power converter in accordance with the prior art.
Figure 2:
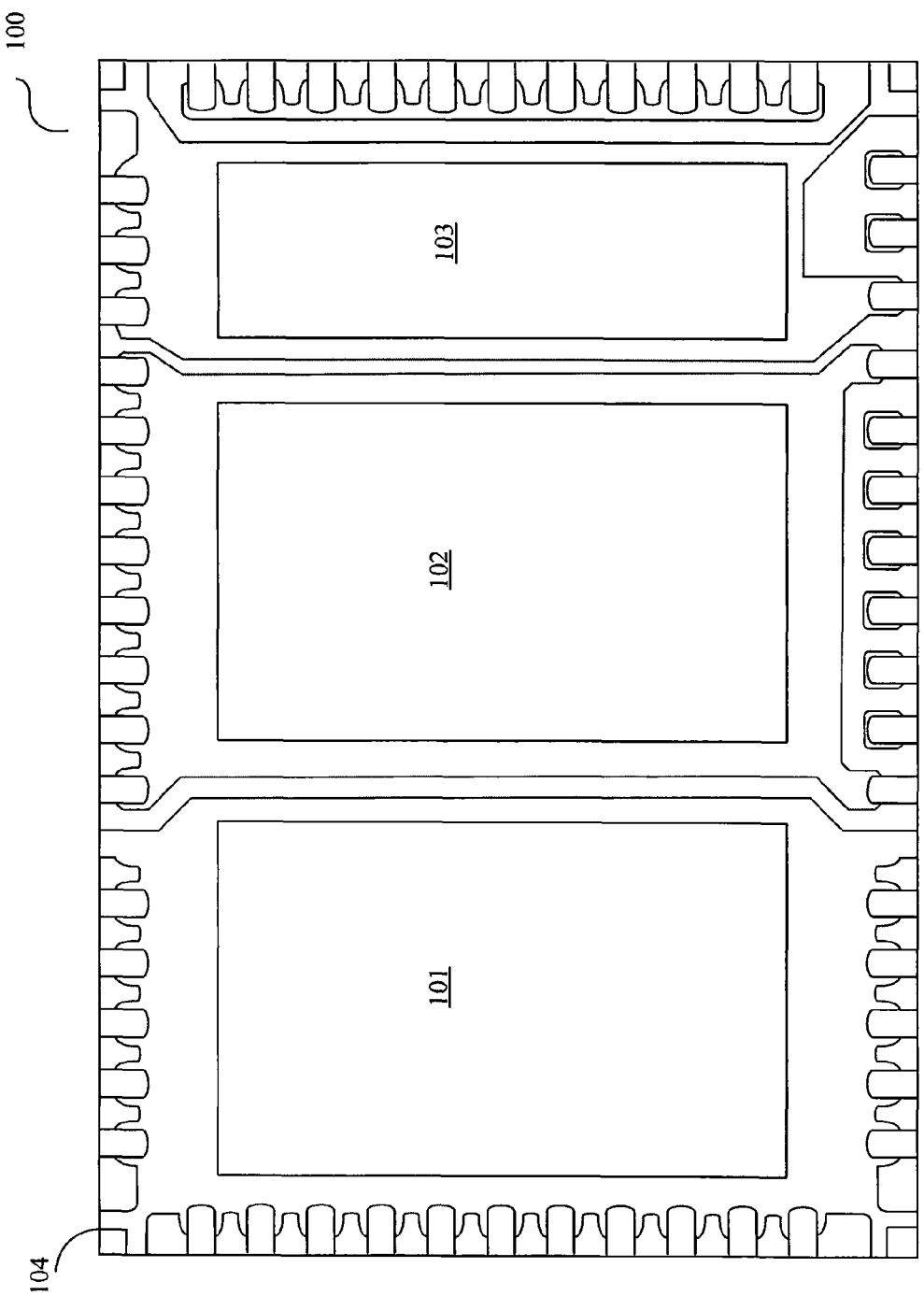
FIG. 2 shows a conventional package for the switching power converter shown in FIG. 1.

Various embodiments of semiconductor devices, packages, and methods of manufacturing are described below. In the following description, some specific details, such as example circuits and example values for these circuit components, are included to provide a thorough understanding of the technology. A person skilled in the relevant art will understand that the technology may have additional embodiments, and that the technology may be practiced without several of the details of the embodiments described below with reference to FIGS. 3-7.

Certain embodiments of the present technology are directed generally to a semiconductor device that includes a first vertical transistor and a second vertical transistor in a stack configuration. In one embodiment, both the first and the second vertical transistors have a source electrode on a back surface and a drain electrode and a gate electrode on a top surface. The second vertical transistor is stacked on top of the first vertical transistor with the source of the second vertical transistor directly contacting the drain of the first vertical transistor.

In another embodiment, the first vertical transistor has a drain electrode on the bottom surface, and source and gate electrodes on the top surface. The first vertical transistor is flip-chip mounted to a lead frame comprising a first plate and a second plate which are electrically isolated. The source electrode and the gate electrode of the first vertical transistor are respectively coupled to the first plate and the second plate of the lead frame. The first vertical transistor further has a contact plate on the bottom surface. The second vertical transistor also has a drain electrode on the bottom surface of the second vertical transistor die, and source and gate electrodes on the top surface. The second vertical transistor is flip-chip mounted to the first vertical transistor with the source and gate electrodes respectively coupled to the drain electrode and the contact plate of the first vertical transistor. The contact plate of the first vertical transistor extends laterally outboard the perimeter of the second vertical transistor die.

By stacking the first and second vertical transistor dies, the footprint of the semiconductor device package can be reduced compared to conventional packages. The resistance and inductance of the interconnection between the first and second vertical transistors can also be reduced. In further embodiments, a control chip (not shown) can be co-packaged with the first and second vertical transistors by being connected to the lead frame, allowing improved thermal performance and smaller, cheaper packages than conventional packages.

The terms "left," right," "in," "out," "front," "back," "up," "down, "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, generally refers to being directly or indirectly connected in an electrical or non-electrical manner.

For the purpose of clarity, the technology is described herein using N-channel vertical power transistors manufactured on and/or in silicon semiconductor substrates as examples. The structures and methods described herein can also be applied to P-channel vertical devices, and/or other types of semiconductor devices. While poly-silicon is described herein as being used for filling trenches in embodiments of the present disclosure, other types of suitable conductive materials (e.g., metals, semiconductors, semi-metals, alloys, and/or combinations thereof) may also be used. Thus, the terms "poly-filled" and "poly-silicon filled" are intended to include such other suitable materials and material combinations in addition to poly-silicon.

Figure 3:
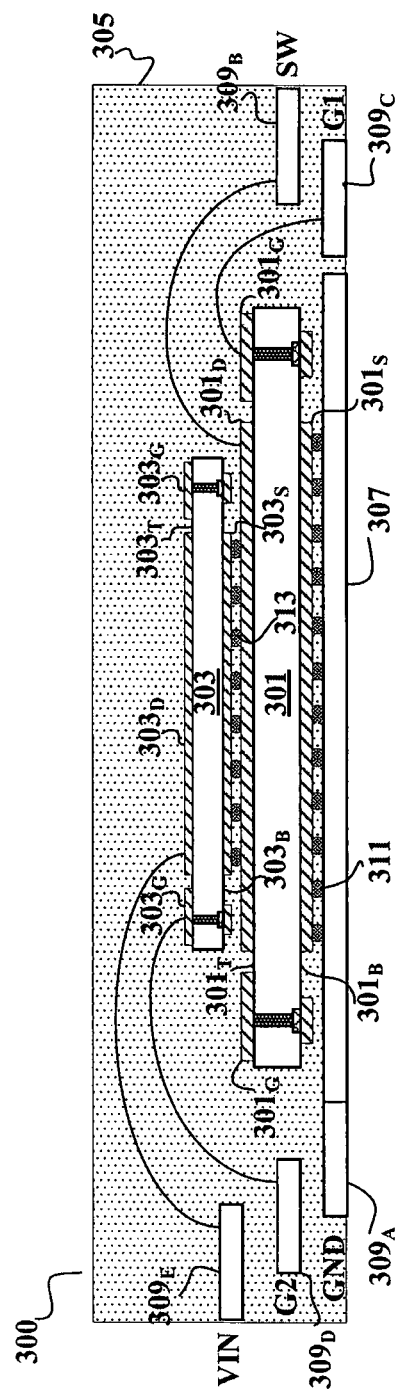
FIG. 3 shows a sectional view of a multi-die semiconductor device in accordance with an embodiment of the present disclosure.

FIG. 3 illustrates a sectional view of a multi-die semiconductor device 300 in accordance with an embodiment of the present disclosure. The multi-die semiconductor device 300 comprises a first vertical transistor die 301 and a second vertical transistor die 303 in a package 305. The package 305 further comprises a lead frame 307 and a plurality of leads $309_A$~$309_E$. In one embodiment, the first vertical transistor die 301 comprises a first vertical transistor having a first source electrode $301_S$, a first drain electrode $301_D$ and a first gate electrode $301_G$. The second transistor die 303 comprises a second vertical transistor having a second source electrode $303_S$, a second drain electrode $303_D$ and a second gate electrode $303_G$. The first source electrode $301_S$ is on a bottom surface $301_B$ of the first transistor die 301, and the first drain electrode $301_D$ and the first gate electrode $301_G$ are on a top surface $301_T$ of the first transistor die 301. The second source electrode $303_S$ is on a bottom surface $303_B$ of the second transistor die 303, and the second drain electrode $303_D$ and the second gate electrode $303_G$ are on a top surface $303_T$ of the second transistor die 303. In other embodiments, the first and/or second transistor dies 301 and 303 may have other suitable configurations.

In one embodiment, the first source electrode $301_S$ and the second source electrode $303_S$ are processed to allow flip-chip packaging. For example, the first source electrode $301_S$ of the first vertical transistor die 301 has contacting sites to allow the first source electrode $301_S$ to be attached and electrically coupled to the lead frame 307 through flip-chip bumps 311. The lead frame 307 may comprise lead $309_A$ which may function, for example, as a ground pin GND. As such, the ground connection is on the lead frame 307, which may be exposed and directly attached to a PCB as a heat sink.

The second source electrode $303_S$ of the second vertical transistor die 303 has contacting sites to allow the second source electrode $303_S$ to be attached and electrically coupled to the first drain electrode $301_D$ of the first vertical transistor die through flip-chip bumps 313. Such direct connection between the first vertical transistor die 301 and the second vertical transistor die 303 can reduce resistance and inductance introduced by bond wires in conventional multi-die packages. In one embodiment, the flip-chip bumps 311 and 313 comprise copper pillar bumps or solder bumps. In other embodiments, the flip-chip bumps 311 and 313 may comprise gold bumps and/or other suitable interconnection structures.

In one embodiment, a portion of the first drain electrode $301_D$ extends beyond a perimeter of the second vertical transistor die 303, so that the second drain electrode $301_D$ can be connected to the lead $309_B$. Similarly, the first gate electrode $301_G$ extends beyond the perimeter of the second vertical transistor die 303, so that the gate electrode $301_G$ can be connected the lead $309_C$ or to a co-packaged control circuit (e.g., generally similar to the controller 103 shown in FIG. 1). In addition, the second gate electrode $303_G$ may be coupled to the lead $309_D$, and the second drain electrode $303_D$ may be coupled to the lead $309_E$. In other embodiments, the first drain electrode $301_D$ and/or the first gate electrode $301_G$ may have other suitable configurations.

In one embodiment, the connection between the first drain electrode $301_D$ and the lead $309_B$, the connection between the first gate electrode $301_G$ and the lead $309_C$, and the connection between the second drain electrode $303_D$ and the lead $309_E$ are by bond wires. In other embodiments, at least one of the foregoing connections may be by other suitable electrical couplers.

In one embodiment, the lead $309_B$ may function as a switching pin SW, the lead $309_C$ may function as a control signal receiving pin G1, the lead $309_D$ may function as another control signal receiving pin G2, and the lead $309_E$ may function as an input pin VIN. In other embodiments, the foregoing leads may have other suitable functions and/or structures.

In one embodiment, the semiconductor device 300 further comprises a co-packaged control circuit (not shown) coupled to the first vertical transistor die 301 and the second vertical transistor die 303 to provide control signals. In one embodiment, instead of being coupled to the lead $309_C$, the first gate electrode $301_G$ of the first vertical transistor die 301 can be coupled to the co-packaged control circuit. In another embodiment, the first gate electrode $301_G$ is coupled to the co-packaged control circuit via bond wires to receive gate control signals. Similarly, the second gate electrode $303_G$ of the second vertical transistor die 303 is also coupled to the co-packaged control circuit.

Figure 4:
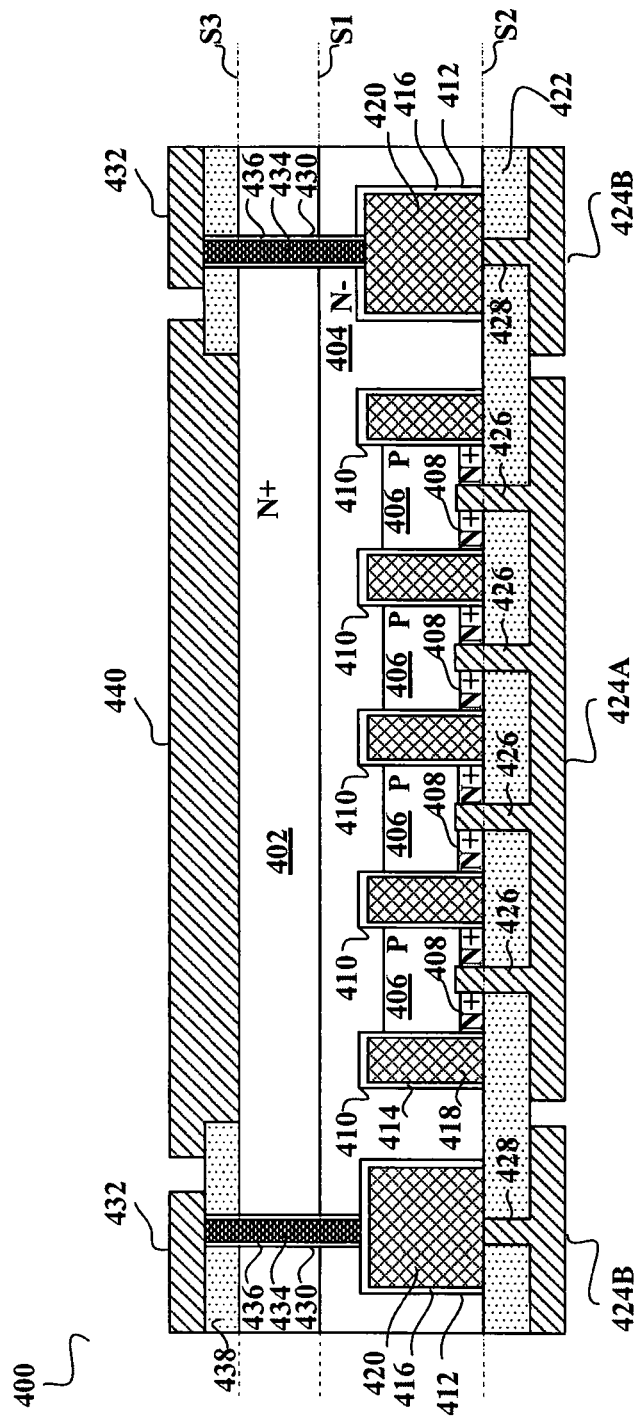
FIG. 4 shows a sectional view of a vertical transistor with topside drain and gate electrodes in accordance with an embodiment of the present disclosure.

FIG. 4 illustrates a sectional view of a vertical transistor 400 with topside drain and gate electrodes in accordance with an embodiment of the present disclosure. The first vertical transistor die 301 and/or the second vertical transistor die 303 of FIG. 3 can have structures and functions generally similar as the vertical transistor 400. As shown in FIG. 4, the vertical transistor 400 may comprise a backside substrate comprising a drain or cathode, such as a vertical trench MOSFET, a VDMOS, a vertical JFET, and/or other suitable devices. In FIG. 4, the vertical transistor 400 is illustrated as a trench gate MOSFET for illustration purposes. However, the vertical transistor 400 can also include planar gate MOSFET, VDMOS, a vertical JFET, and/or suitable devices.

In the illustrated embodiment, the vertical transistor 400 comprises a highly doped N+ substrate 402 with a drain of the vertical transistor 400. An N-epitaxial layer 404 is on a bottom surface S1 of the N+ substrate 402. In the N-epitaxial layer 404, P type body regions 406, N+ source regions 408, gate trenches 410 and gate contact trenches 412 are formed. Insulating material 414 is formed on the sidewalls and at the bottom of the gate trenches 410 and insulating material 416 is formed on the sidewalls and at the bottom of the gate contact trenches 412. In one embodiment, the insulating material 414 and the insulating material 416 comprise the same material such as gate oxide and may be formed at the same time. In other embodiments, the insulating materials 414 and 416 can include different materials and/or formed at different processing stages.

The gate 418 is formed in the gate trenches 410 and the gate contact 420 is formed in the gate contact trenches 412. In one embodiment, both the gate 418 and the gate contact 420 comprise the same material such as highly doped polysilicon and may be formed at the same time. In other embodiments, the gate 418 and the gate contact 420 can include different materials and/or formed at different processing stages.

In one embodiment, the gate trenches 410 and the gate contact trenches 412 are connected by a transverse segment of either the gate trenches 410 or the gate contact trenches 412. A dielectric layer 422 such as TEOS (tetraethoxysilane), PSG (phosphosilicate glass), BPSG (borophosphosilcate glass) or SOG (spin-on glass) is formed on a bottom surface S2 of the N-epitaxial layer 404 to separate the source electrode 424A and the gate electrode 424B from the underlying body regions 406, source regions 408, and gates 418. Source contact openings 426 allow electrical contact between the source electrode 424A and the N+ source regions 408 and the P type body regions 406. Similarly, gate contact openings 428 allow electrical contact between the gate electrode 424B and the gates 418.

The vertical transistor 400 further comprises trenches 430 for connecting the gate contacts 420 to a top side gate electrode 432 at a top surface S3 of the N+ substrate 402. A gate contact 434 comprising a conductive material such as tungsten or heavily-doped polysilicon, extends through the trenches 430 and provides electrical contact between the top side gate electrode 432 and the gate contacts 420. A trench insulator 436 comprising an insulating material such as oxide, lines the walls of the trenches 430 and electrically isolates gate contacts 434 from the substrate 402 and the epitaxial layer 404. A dielectric layer 438 can be formed on the second surface S3 of the N+ substrate 402, and a metallization layer is formed on the surface of the dielectric layer 438, patterned and etched to form separate drain electrode 440 and gate electrode 432 on the topside surface of the vertical transistor 400.

Many variants of vertical transistors with drain and gate electrodes on the top surface can also be fabricated. In one embodiment, the bottom side gate electrode 424B of FIG. 4 is not formed, so that the bottom side surface of the vertical transistor 400 can be used to form source electrode 424A. In another embodiment, the trenches 430 are etched substantially entirely through the dielectric layer 438, the N+ substrate 402, the N-epitaxial layer 404 and the dielectric layer 422 to contact the bottom side gate electrode 424B.

Figure 5:
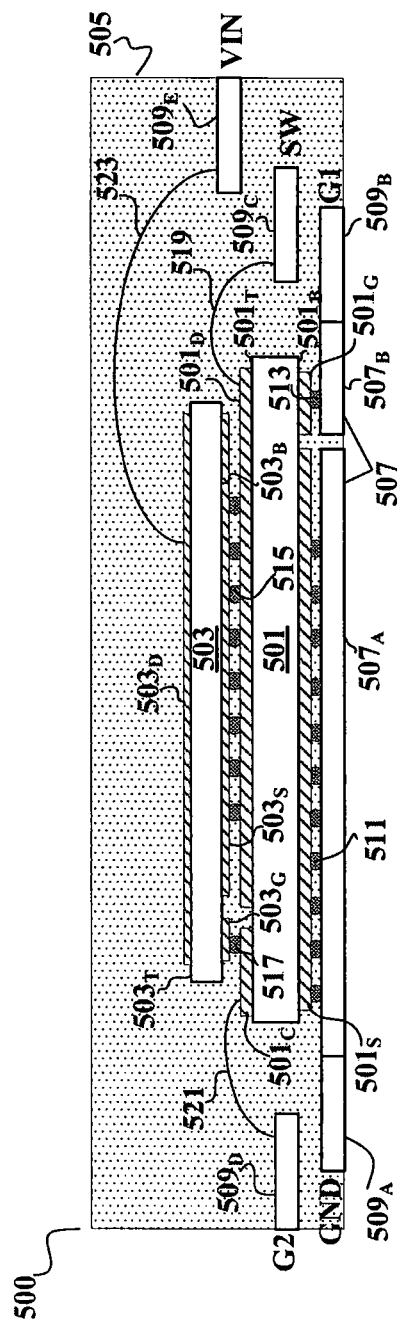
FIG. 5 shows a sectional view of a multi-die semiconductor device in accordance with an embodiment of the present disclosure.

FIG. 5 illustrates a sectional view of a multi-die semiconductor device 500 in accordance with an embodiment of the present disclosure. The multi-die semiconductor device 500 comprises a first vertical transistor die 501 and a second vertical transistor die 503 in a package 505. The package 505 further comprises a lead frame 507 and a plurality of leads $509_A$~$509_E$.

In one embodiment, the first vertical transistor die 501 comprises a first vertical transistor having a first drain electrode $501_D$, a first source electrode $501_S$ and a first gate electrode $501_G$. The first drain electrode $501_D$ is on a top surface $501_T$ of the first vertical transistor die 501, and the first source electrode $501_S$ and the first gate electrode $501_G$ are on a bottom surface $501_B$ of the first vertical transistor die 501. The first vertical transistor die 501 further comprises a contact plate $501_C$ on the top surface $501_T$. The contact plate $501_C$ is electrically isolated from the first drain electrode $501_D$ and from a substrate of the first vertical transistor 501.

In addition, the second vertical transistor die 503 comprises a second vertical transistor having a second drain electrode $503_D$, a second source electrode $503_S$ and a second gate electrode $503_G$. The second drain electrode $503_D$ is on a top surface $503_T$ of the second vertical transistor die 503, and the second source electrode $503_S$ and the second gate electrode $503_G$ are on a bottom surface $503_B$ of the second vertical transistor die 503. The second vertical transistor die 503 may comprise a vertical MOSFET, VDMOS, JFET, and/or other suitable devices.

In certain embodiments, the first vertical transistor 501 and/or the second vertical transistor 503 may comprise: a substrate having a top surface and a bottom surface opposite the top surface; an epitaxial layer on the top surface of the substrate, the epitaxial layer having a top surface opposite the top surface of the substrate; a source region and a gate in the epitaxial layer and adjacent to the top surface of the epitaxial layer; a source electrode on the top surface of the epitaxial layer and being coupled to the source region and isolated from the gate; a drain electrode on the bottom surface of the substrate and being coupled to the substrate functioning as a drain; and a gate electrode adjacent to the top surface of the epitaxial layer and isolated from the source region.

In one embodiment, the lead frame 507 is patterned to comprise a first plate $507_A$ for receiving the first source electrode $501_S$ and a second plate $507_B$ for receiving the first gate electrode $501_G$. The first plate $507_A$ and the second plate $507_B$ are electrically isolated from each other. In other embodiments, the lead frame 507 can also include die paddles, additional plates, and/or other suitable components and/or structures.

In one embodiment, the first vertical transistor die 501 is flip-chip mounted with the bottom surface $501_B$ coupled to the lead frame 507. The first source electrode $501_S$ and the first gate electrode $501_G$ are processed to allow flip-chip packaging. For example, the first source electrode $501_S$ of the first vertical transistor die 501 has contacting sites to allow the first source electrode $501_S$ to be attached and electrically coupled to the first plate $507_A$ through flip-chip bumps 511. Similarly, the first gate electrode $501_G$ has contacting sites to allow the first gate electrode $501_G$ be attached and electrically coupled to the second plate $507_B$ through flip-chip bumps 513.

In one embodiment, the first plate $507_A$ may be connected to the lead $509_A$ for connection on a PCB. The lead $509_A$ may function, for example, as the ground pin GND. In such a way, the ground connection is on the first plate $507_A$ of the lead frame 507 which is exposed and serves as a heat sink. In one embodiment, the second plate $507_B$ is electrically coupled to the lead $509_B$ which may function as a gate control signal receiving pin G1. In other embodiments, the first and/or second plates $507_A$ and $507_B$ may have other suitable functions and/or structures.

As shown in FIG. 5, the second vertical transistor die 503 is stacked on the first vertical transistor die 501 with the second source electrode $503_S$ coupled to the first drain electrode $501_D$. The second source electrode $503_S$ and the second gate electrode $503_G$ of the second vertical transistor die 503 are also processed to allow flip-chip packaging. In one embodiment, the second source electrode $503_S$ has contacting sites to allow the second source electrode $503_S$ be attached and electrically coupled to the first drain electrode $501_D$ of the first vertical transistor die through flip-chip bumps 515. Such direct connection between the first vertical transistor die 501 and the second vertical transistor die 503 can reduce the resistance and inductance introduced by bond wires in conventional multi-die parallel packages. In one embodiment, the second gate electrode has contacting sites to allow the second gate electrode $503_G$ be attached and electrically coupled to the contact plate $501_C$ on the top surface $501_T$ of the first vertical transistor die 501 through flip-chip bumps 517. In other embodiments, the second gate electrode can have other suitable configurations. In one embodiment the flip-chip bumps 511, 513, 515 and 517 may comprise copper pillar bumps or solder bumps. In other embodiments, at least one of the flip-chip bumps 511, 513, 515 and 517 may include other suitable interconnection structures.

In one embodiment, a portion of the first drain electrode $501_D$ and a portion of the contact plate $501_C$ of the first vertical transistor die 501 extend beyond the perimeter of the second vertical transistor die 503, such that the first drain electrode $501_D$ may be connected to the lead $509_C$; and the contact plate $501_C$ and the second gate electrode $503_G$ may be connected to the lead $509_D$. In one embodiment, the first drain electrode $501_D$ is connected to the lead $509_C$ via bond wires 519. The contact plate $501_C$ is connected to the lead $509_D$ via bond wires 521, coupling the second gate electrode $503_G$ to the lead $509_D$. The second drain electrode $503_D$ of the second vertical transistor die 503 is coupled to the lead $509_E$ via bond wires 523. In other embodiments, other suitable interconnection components may also be used. In one embodiment, the lead $509_C$ may function as a switching pin SW, the lead $509_D$ may function as a gate control signal receiving pin G2, and the lead $509_E$ may function as a power supply receiving pin VIN. In other embodiments, the foregoing leads $509_C$, $509_D$, and $509_E$ may have other suitable functions.

In one embodiment, the semiconductor device 500 further comprises a co-packaged control circuit (not shown) coupled to the first vertical transistor die 501 and the second vertical transistor die 503 to provide control signals. In one embodiment, the first gate electrode $501_G$ of the first vertical transistor die 501 is coupled to the co-packaged control circuit via bond wires to receive gate control signals. In another embodiment, the second gate electrode $503_G$ of the second vertical transistor die 503 is coupled to the co-packaged control circuit via bond wires to receive gate control signals.

Figure 6:
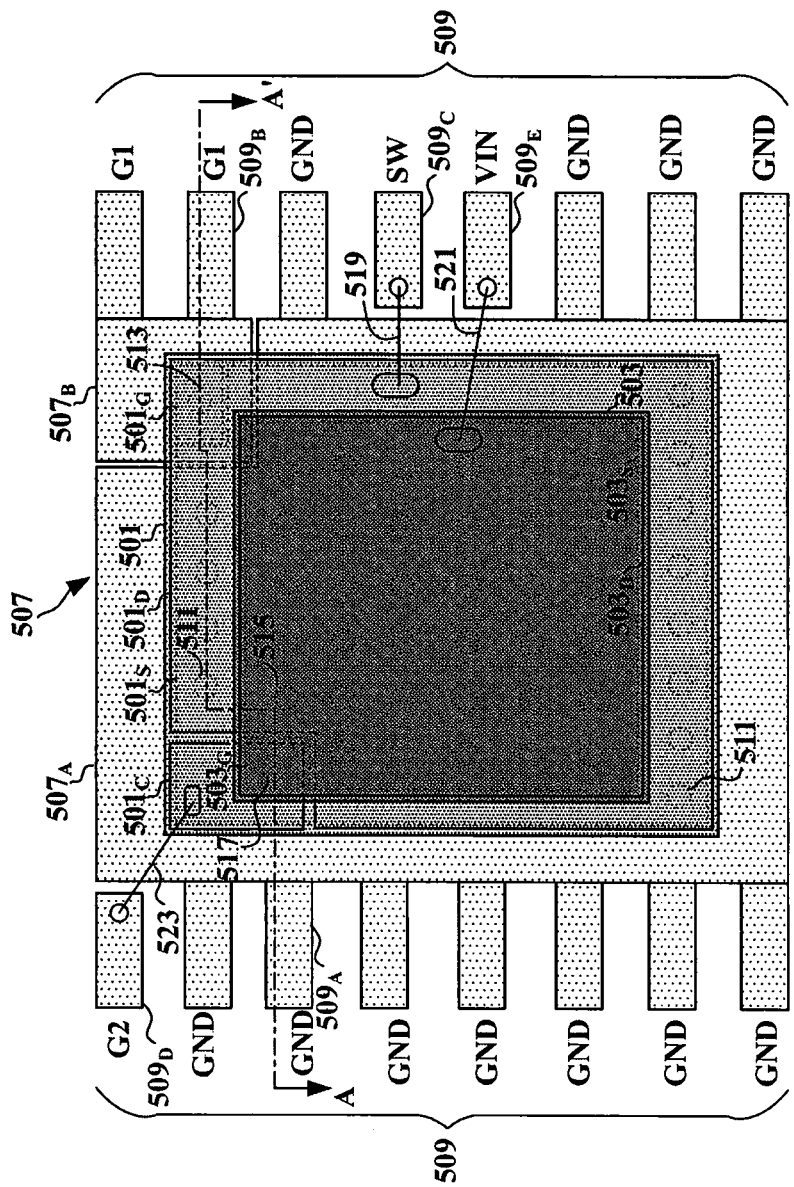
FIG. 6 shows a top plan view of the multi-die semiconductor device in FIG. 5 in accordance with an embodiment of the present disclosure.

FIG. 6 illustrates a top plan view of the multi-die semiconductor device 500 in FIG. 5. As shown in FIG. 6, the sectional view of the semiconductor device 500 illustrated in FIG. 5 can be viewed as being taken from line AA' in FIG. 6. As shown in FIG. 6, the first vertical transistor die 501 is mounted onto the lead frame 507 with its source electrode (the first source electrode) $501_S$ electrically coupled to the first plate $507_A$ via flip-chip bumps 511 and its gate electrode (the first gate electrode) $501_G$ electrically coupled to the second plate $507_B$ via flip-chip bumps 513. The second vertical transistor die 503 is directly stacked on the first vertical transistor die 501. The second source electrode $503_S$ of the second vertical transistor die 503 is electrically coupled to the first drain electrode $501_D$ of the first vertical transistor die 501 via flip-chip bumps 515. The second gate electrode $503_G$ of the second vertical transistor die 503 is electrically coupled to the contact plate $501_C$ of the first vertical transistor die 501 via flip-chip bumps 517. The first drain electrode $501_D$ of the first vertical transistor die 501 is coupled via a bond wire 519 to a lead $509_C$ which functions, for example, as the switching pin SW.

The second drain electrode $503_D$ of the second vertical transistor die 503 is coupled via a bond wire 521 to a lead $509_E$ which functions, for example, as the power supply pin VIN. The contact plate $501_C$ of the first vertical transistor die 501 is coupled via a bond wire 523 to a lead $509_D$ which functions, for example, as a gate control signal receiving pin G2 for coupling gate control signals to the gate electrode $503_G$ of the second vertical transistor die 503. The first plate $507_A$ of the lead frame 507 is connected to a lead $509_A$ which functions for example as a ground pin GND so that the first source electrode $501_S$ of the first vertical transistor die 501 is coupled to ground. The second plate $507_B$ of the lead frame 507 is connected to a lead $509_B$ which functions as a gate control signal receiving pin G1 for coupling gate control signals to the gate electrode $501_G$ of the first vertical transistor die 501.

Figure 7:
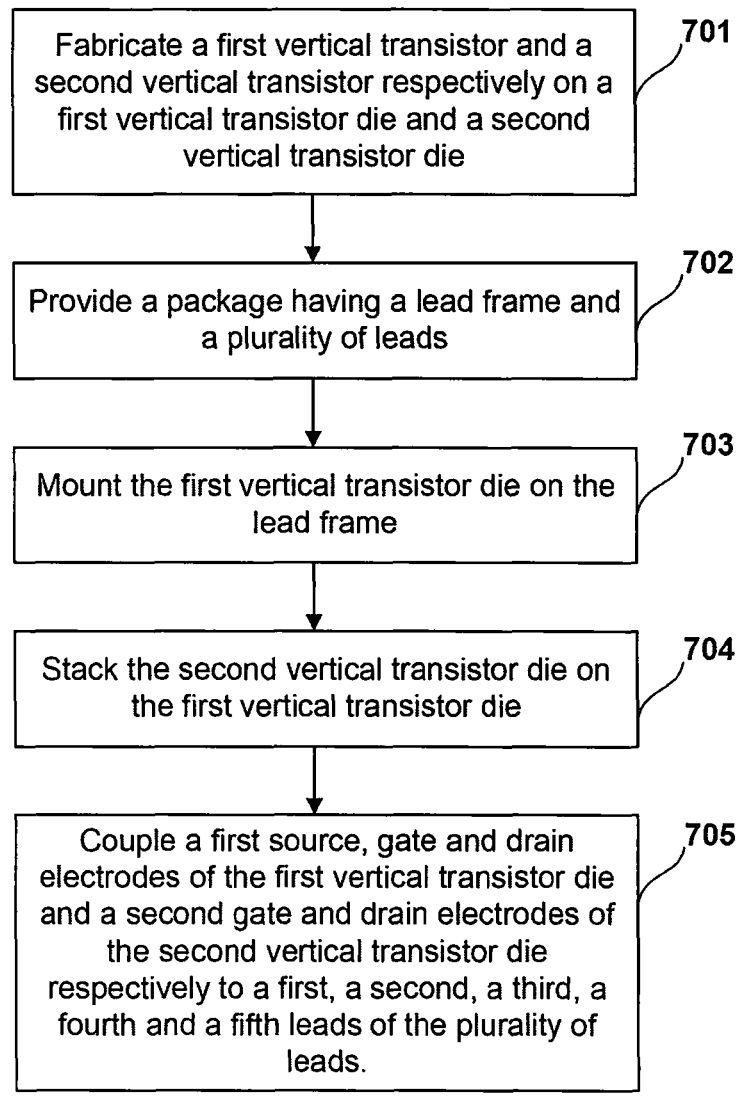
FIG. 7 shows a flowchart illustrating a method of forming a semiconductor device integrating a first die and a second die in accordance with an embodiment of the present disclosure.

FIG. 7 illustrates a flowchart illustrating a method of forming a semiconductor device with a first vertical transistor die and a second vertical transistor die in accordance with an embodiment of the present disclosure. As shown in FIG. 7, the method comprises:

Stage 701, fabricating a first vertical transistor on the first vertical transistor die and fabricating a second vertical transistor on the second vertical transistor die. The first vertical transistor has a first source electrode, a first drain electrode and a first gate electrode. The second vertical transistor having a second source electrode, a second drain electrode and a second gate electrode.

Stage 702, providing a package having a lead frame and a plurality of leads.

Stage 703, mounting the first vertical transistor die on the lead frame with the first source electrode electrically coupled to the lead frame.

Stage 704, stacking the second vertical transistor die on the first vertical transistor die with the second source electrode coupled to the first drain electrode of the first vertical transistor die.

In certain embodiments, the method may further comprise stage 705, coupling the first source, gate and drain electrodes and the second gate and drain electrodes respectively to a first lead, a second lead, a third lead, a fourth lead and a fifth lead of the plurality of leads. The lead frame is connected to the first lead of the plurality of leads; the first gate electrode is coupled to the second lead of the plurality of leads by a first bond wire; the first drain electrode is coupled to a third lead of the plurality of leads by a second bond wire; the second gate electrode is coupled to a fourth lead of the plurality of leads by a third bond wire; and the second drain electrode is coupled to a fifth lead of the plurality of leads by a fourth bond wire.

In certain embodiments, the first vertical transistor die may have a first surface and a second surface, and the second vertical transistor die may have a first surface and a second surface. The first and the second surfaces of the first vertical transistor die are generally parallel, and the first and the second surfaces of the second vertical transistor die are generally parallel.

In one embodiment, at stage 701, fabricating the first vertical transistor comprises forming the first drain electrode and the first gate electrode on the first surface of the first vertical transistor die, and forming the first source electrode on the second surface of the first vertical transistor die. Fabricating the second vertical transistor comprises forming the second drain electrode and the second gate electrode on the first surface of the second vertical transistor die, and forming the second source electrode on the second surface of the second vertical transistor die. In certain embodiments, the second vertical transistor die is smaller than the first vertical transistor die to expose a portion of the first drain electrode.

In one embodiment, at stage 701, fabricating the first vertical transistor comprises forming the first source electrode and the first gate electrode on the first surface of the first vertical transistor die, and forming the first drain electrode on the second surface of the first vertical transistor die. Fabricating the first vertical transistor further comprises forming a contact plate on the second surface of the first vertical transistor die. Fabricating the second vertical transistor comprises forming the second drain electrode and the second gate electrode on the first surface of the second vertical transistor die, and forming the second drain electrode on the second surface of the second vertical transistor die. In one embodiment, the second vertical transistor die is smaller than the first vertical transistor die to expose a portion of the first drain electrode and a portion of the contact plate. At stage 702, providing the package comprises providing a lead frame having a first plate and a second plate, and the first and the second plates are electrically isolated. At stage 703, mounting the first vertical transistor die on the lead frame comprises coupling the first source electrode to the first plate of the lead frame; and coupling the first gate electrode to the second plate of the lead frame. At stage 704, stacking the second vertical transistor die on the first vertical transistor die further comprises coupling the second gate electrode to the contact plate of the first vertical transistor die. At stage 705, the first plate of the lead frame is coupled to the first lead of the plurality of leads; the second plate of the lead frame is coupled to the second lead of the plurality of leads; the first drain electrode of the first vertical transistor die is coupled to the third lead of the plurality of leads by a first bond wire; the contact plate of the first vertical transistor die is coupled to the fourth lead of the plurality of leads by a second bond wire; and the second drain electrode is coupled to the fifth lead of the plurality of leads by a third bond wire.

From the foregoing, it will be appreciated that specific embodiments of the technology have been described herein for purposes of illustration, but that various modifications may be made without deviating from the disclosed technology. Elements of one embodiment may be combined with other embodiments in addition to or in lieu of the elements of the other embodiments. Accordingly, the technology is not limited except as by the appended claims.

I claim:

1. A semiconductor device, comprising:
a lead frame, comprising a first plate and a second plate, wherein the first and the second plates are electrically isolated from each other;
a first vertical power transistor die comprising a first vertical power transistor having a first source electrode, a first drain electrode, and a first gate electrode, the first vertical power transistor die being attached to the lead frame with the first source electrode being coupled to the first plate of the lead frame via flip-chip bumps and the first gate electrode being coupled to the second plate of the lead frame via flip-chip bumps; and
a second vertical power transistor die comprising a second vertical power transistor having a second source electrode, a second drain electrode and a second gate electrode, the second vertical power transistor die being stacked on the first vertical power transistor die with the second source electrode coupled to the first drain electrode via flip-chip bumps; wherein
the first vertical power transistor comprises a first substrate having a top surface and a bottom surface opposite to the top surface, and a first epitaxial layer having a top surface in contact with the bottom surface of the first substrate and a bottom surface opposite to the top surface of the first epitaxial layer, wherein the first substrate functions as a drain of the first vertical power transistor, and wherein the first drain electrode is on the top surface of the first substrate, and the first source electrode and the first gate electrode are on the bottom surface of the first epitaxial layer; and wherein
the second vertical power transistor comprises a second substrate having a top surface and a bottom surface opposite to the top surface, and a second epitaxial layer having a top surface in contact with the bottom surface of the second substrate and a bottom surface opposite to the top surface of the second epitaxial layer, wherein the second substrate functions as a drain of the second vertical power transistor, and wherein the second drain electrode is on the top surface of the second substrate, and the second source electrode and the second gate electrode are on the bottom surface of the second epitaxial layer; and wherein
the first vertical power transistor die further comprises a contact plate on the top surface of the first substrate, wherein the contact plate is electrically isolated from the first drain electrode and from the first substrate, and the contact plate extends laterally outboard the perimeter of the second vertical power transistor and is coupled to a lead of a plurality of leads by a bond wire, and wherein the second gate electrode of the second vertical power transistor is coupled to the contact plate of the first vertical power transistor die via flip-chip bumps.

2. The semiconductor device of claim 1, wherein the first vertical power transistor further comprises:
a source region and a gate in the first epitaxial layer and adjacent to the bottom surface of the first epitaxial layer; and
a gate contact coupling the gate to the first gate electrode, wherein
the first source electrode is coupled to the source region and isolated from the gate; and wherein
the first gate electrode is isolated from the first substrate.

3. The semiconductor device of claim 2, wherein the gate contact includes a trench having sidewalls lined with an insulating material and filled with a conductive material.

4. The semiconductor device of claim 1, wherein the second vertical power transistor further comprises:
a source region and a gate in the second epitaxial layer and adjacent to the bottom surface of the second epitaxial layer; and
a gate contact coupling the gate to the second gate electrode, and wherein
the second source electrode is coupled to the source region and isolated from the gate; and wherein
the second gate electrode is isolated from the second substrate.

5. The semiconductor device of claim 4, wherein the gate contact includes a trench having sidewalls lined with an insulating material and filled with a conductive material.

6. The semiconductor device of claim 1, wherein the first vertical power transistor die further comprises:
a source region and a gate in the first epitaxial layer and adjacent to the bottom surface of the first epitaxial layer, and wherein
the first source electrode is coupled to the source region and isolated from the gate; and wherein
the first gate electrode is isolated from the source region.

7. The semiconductor device of claim 1, wherein the second vertical power transistor die further comprises:
- a source region and a gate in the second epitaxial layer and adjacent to the bottom surface of the second epitaxial layer, and wherein
- the second source electrode is coupled to the source region and isolated from the gate; and wherein
- the second gate electrode is isolated from the source region.

8. The semiconductor device of claim 1, wherein:
- the first plate of the lead frame is coupled to a first lead of the plurality of leads;
- the second plate of the lead frame is coupled to a second lead of the plurality of leads;
- the first drain electrode of the first vertical power transistor die is coupled to a third lead of the plurality of leads by a first bond wire;
- the contact plate of the first vertical power transistor die is coupled to a fourth lead of the plurality of leads by a second bond wire; and
- the second drain electrode is coupled to a fifth lead of the plurality of leads by a third bond wire.

9. The semiconductor device of claim 1, further comprising a control circuit die, and wherein:
- the first plate of the lead frame is coupled to a first lead of the plurality of leads;
- the second plate of the lead frame is coupled to the control circuit die to receive a first gate control signal;
- the first drain electrode of the first vertical power transistor die is coupled to a second lead of the plurality of leads by a first bond wire;
- the contact plate of the first vertical power transistor die is coupled to the control circuit die by a second bond wire to receive a second gate control signal; and
- the second drain electrode is coupled to a fourth lead of the plurality of leads by a third bond wire.

10. A method of forming a semiconductor device with a first vertical power transistor die and a second vertical power transistor die, comprising:
- fabricating a first vertical power transistor having a first source electrode, a first drain electrode, and a first gate electrode;
- fabricating a second vertical power transistor having a second source electrode, a second drain electrode, and a second gate electrode;
- mounting the first vertical power transistor die on a lead frame having a first plate and a second plate electrically isolated from each other, wherein the first source electrode is coupled to the first plate of the lead frame and the first gate electrode is coupled to the second plate of the lead frame; and
- stacking the second vertical power transistor die on the first vertical power transistor die with the second source electrode coupled to the first drain electrode of the first vertical power transistor die; wherein
- fabricating the first vertical power transistor comprises: providing a first substrate having a top surface and a bottom surface opposite to the top surface, wherein the first substrate functions as a drain of the first vertical power transistor; forming a first epitaxial layer having a top surface in contact with the bottom surface of the first substrate and a bottom surface opposite to the top surface of the first epitaxial layer; forming the first drain electrode on the top surface of the first substrate, and forming the first source electrode and the first gate electrode on the bottom surface of the first epitaxial layer; and
- fabricating the second vertical power transistor comprises: providing a second substrate having a top surface and a bottom surface opposite to the top surface, wherein the second substrate functions as a drain of the second vertical power transistor; forming a second epitaxial layer having a top surface in contact with the bottom surface of the second substrate and a bottom surface opposite to the top surface of the second epitaxial layer; forming the second drain electrode on the top surface of the second substrate, and forming the second source electrode and the second gate electrode on the bottom surface of the second epitaxial layer; and wherein
- fabricating the first vertical power transistor further comprises forming a contact plate on the top surface of the first substrate, wherein the contact plate is electrically isolated from the first drain electrode and from the first substrate, and the contact plate extends laterally outboard the perimeter of the second vertical power transistor die and is coupled to a lead of a plurality of leads by a bond wire; and wherein
- stacking the second vertical power transistor die on the first vertical power transistor die further comprises coupling the second gate electrode to the contact plate of the first vertical power transistor.

* * * * *